(12) United States Patent
Parteder et al.

(10) Patent No.: US 12,362,230 B2
(45) Date of Patent: Jul. 15, 2025

(54) METHOD OF PRODUCING A SEMICONDUCTOR BODY WITH A TRENCH, SEMICONDUCTOR BODY WITH AT LEAST ONE TRENCH AND SEMICONDUCTOR DEVICE

(71) Applicant: ams AG, Premstätten (AT)

(72) Inventors: Georg Parteder, Sankt Ruprecht an der Raab (AT); Thomas Bodner, Seiersberg (AT)

(73) Assignee: AMS AG, Premstätten (AT)

( * ) Notice: Subject to any disclaimer, the term of this patent is extended or adjusted under 35 U.S.C. 154(b) by 489 days.

(21) Appl. No.: 17/771,350

(22) PCT Filed: Oct. 23, 2020

(86) PCT No.: PCT/EP2020/079883
§ 371 (c)(1),
(2) Date: Apr. 22, 2022

(87) PCT Pub. No.: WO2021/078940
PCT Pub. Date: Apr. 29, 2021

(65) Prior Publication Data
US 2022/0352016 A1 Nov. 3, 2022

(30) Foreign Application Priority Data
Oct. 25, 2019 (EP) .................... 19205357

(51) Int. Cl.
*H01L 21/768* (2006.01)
*H01L 23/48* (2006.01)
(Continued)

(52) U.S. Cl.
CPC .. *H01L 21/76831* (2013.01); *H01L 21/76898* (2013.01); *H01L 23/481* (2013.01); *H10D 62/235* (2025.01); *H10F 39/811* (2025.01)

(58) Field of Classification Search
CPC ......... H01L 21/76224; H01L 21/76831; H01L 21/76898; H01L 23/481; H01L 27/14636; H10D 62/235; H10F 39/811
See application file for complete search history.

(56) References Cited

U.S. PATENT DOCUMENTS 5,877,067 A * 3/1999 Kimura ................ H01L 21/763
438/432
8,378,496 B2 2/2013 Schrank et al.
(Continued)

FOREIGN PATENT DOCUMENTS

CN 102420210 A 4/2012
EP 0166141 A2 1/1986
(Continued)

OTHER PUBLICATIONS

Notification of Reasons for Refusal issued in corresponding JP Patent Appl. Publ. No. 2010-287823 mailed on May 9, 2023, 12 pages, with English language translation.

(Continued)

*Primary Examiner* — Zandra V Smith
*Assistant Examiner* — John M Parker
(74) *Attorney, Agent, or Firm* — MH2 Technology Law Group LLP

(57) ABSTRACT

A method is proposed of producing a semiconductor body with a trench. The semiconductor body comprises a substrate. The method comprising the step of etching the trench into the substrate using an etching mask. An oxide layer is formed at least on a sidewall of the trench by oxidation of the substrate. A passivation layer is formed on the oxide layer and the bottom of the trench. The passivation layer is removed from the bottom of the trench. Finally, a metallization layer is deposited into the trench.

13 Claims, 4 Drawing Sheets

(51) Int. Cl.
  *H10D 62/17* (2025.01)
  *H10F 39/00* (2025.01)

(56) References Cited

U.S. PATENT DOCUMENTS

| | | | |
|---|---|---|---|
| 9,613,864 B2* | 4/2017 | Lu | H01L 23/481 |
| 9,859,420 B1* | 1/2018 | Balakrishnan | H01L 29/66545 |
| 11,289,404 B2* | 3/2022 | Liu | H01L 21/76898 |
| 2009/0093117 A1* | 4/2009 | Taguchi | H01L 21/486 438/667 |
| 2011/0151633 A1* | 6/2011 | Park | H01L 29/66621 438/270 |
| 2012/0074582 A1 | 3/2012 | Yu et al. | |
| 2013/0043554 A1* | 2/2013 | Piper | H01L 23/481 257/E21.546 |
| 2013/0105947 A1 | 5/2013 | Fuller et al. | |
| 2015/0104927 A1* | 4/2015 | Chen | H10D 88/01 438/459 |
| 2016/0027929 A1* | 1/2016 | Cheng | H01L 29/1037 438/151 |
| 2018/0068949 A1* | 3/2018 | Chen | H01L 21/0228 |
| 2018/0151475 A1 | 5/2018 | Oshige | |
| 2018/0151666 A1* | 5/2018 | Yew | H01L 21/31144 |
| 2020/0381301 A1* | 12/2020 | Hong | H01L 21/02063 |

FOREIGN PATENT DOCUMENTS

| | | |
|---|---|---|
| EP | 2048923 A2 | 4/2009 |
| EP | 2077577 A1 | 7/2009 |
| JP | 2010287823 A | 12/2010 |
| WO | 2010081603 A1 | 7/2010 |
| WO | 2015055480 A1 | 4/2015 |

OTHER PUBLICATIONS

Extended European Search Report in corresponding EP Application No. 19205357.7 mailed on Apr. 17, 2020, 10 pages.

Antonenko et al., "Oxidation Kinetics of a Silicon Surface in a Plasma of Oxygen with Inert Gases", Optoelectronics, Instrumentation and Data Processing, vol. 47, No. 5, 2011, pp. 459-464.

Angermann et al., "Electronic interface properties of silicon substrates after ozone based wet-chemical oxidation studied by SPV measurements", Applied Surface Science, vol. 258, 2012, pp. 8387-8396.

Choi et al., "A study of the mechanisms causing surface defects on sidewalls during Si etching for TSV (through Si via)", Journal of Micromechanics and Microengineering, vol. 23, 2013, 7 pages.

Kakiuchi et al., "Formation of silicon dioxide layers at low temperatures (150-400 1C) by atmospheric pressure plasma oxidation of silicon", Science and Technology of Advanced Materials, vol. 8, 2007, pp. 137-141.

Kraft et al., "3D Sensor Application with Open Through Silicon Via Technology", Electronic Components and Technology Conference, 2011, pp. 560-566.

Laviron et al., "Via First Approach Optimisation for Through Silicon Via Applications", Electronic Components and Technology Conference, 2009, pp. 14-19.

Nakamura et al., "Comparative Study of Side-Wall Roughness Effects on Leakage Currents in Through-Silicon via Interconnects", 2011 IEEE International 3D Systems Integration Conference (3DIC), 2011, pp. 1-4.

Parteder et al., "TSV with 40 μm diameter replacing wiring pads", MiNaPAD 2017, May 17-18, 5 pages.

Schrank et al., "80 μm open TSV technology", Minapad 2015, Apr. 22 and 23, 7 pages.

Shen et al., "Three-Dimensional Integrated Circuit (3D IC) Key Technology: Through-Silicon via (TSV)", Nanoscale Research Letters, vol. 12, No. 56, 2017, 9 pages.

International Search Report and Written Opinion in corresponding International Application No. PCT/EP2020/079883 mailed on Jan. 22, 2021, 13 pages.

European Communication pursuant to Article 94(3) EPC issued in corresponding European Patent Application No. 19205357.7 mailed on Jan. 15, 2025, 6 pages.

Chinese Office Action issued in corresponding Chinese Patent Application No. 2020800725902, dated May 13, 2025, with English language translation, 18 pages.

European Communication pursuant to Article 94(3) EPC issued in corresponding European Patent Application No. 19 205 357.7, dated May 27, 2025, 4 pages.

* cited by examiner

METHOD OF PRODUCING A SEMICONDUCTOR BODY WITH A TRENCH, SEMICONDUCTOR BODY WITH AT LEAST ONE TRENCH AND SEMICONDUCTOR DEVICE

CROSS-REFERENCE TO RELATED APPLICATIONS

The present application is the national stage entry of International Patent Application No. PCT/EP2020/079883, filed on Oct. 23, 2020, and published as WO 2021/078940 A1 on Apr. 29, 2021, which claims the benefit of priority of European Patent Application No. 19205357.7, filed on Oct. 25, 2019, all of which are incorporated by reference herein in their entireties.

FIELD OF THE INVENTION

This invention relates to the field of interconnect technology, such as vertical electrical connections, vias, that pass through a die or a silicon wafer, including through-silicon vias, TSVs.

BACKGROUND OF THE INVENTION

In electronic engineering, high performance interconnect technology such as wire-bond and flip chips, is used to create 3D packages and 3D integrated circuits. A through-silicon via, TSV, is a vertical electrical connection, or via, that passes through a silicon wafer or die. TSVs allow for higher device density and lengths of connections become shorter. Through silicon via structures are often key enabler for novel applications and innovative designs in advanced packaging applications. Typically, TSVs are used to implement connections between chips of different functions such as memory and logic.

A 3D IC fabrication process may involve the following basic steps, namely wafer thinning, TSV etching, isolation and metallization, as well as backside metallization and passivation processing. Such TSV technology demands for an etch process which is capable of producing deep features with exceptional anisotropy and high etch rates. In order to fulfil these requirements deep reactive ion etching processes, DRIE, such as the Bosch process have been developed. FIG. 3 shows a flowchart of an example Bosch process. The Bosch process may consists of a series of alternating etch and deposition cycles, each lasting only a few seconds. The deposition step coats a feature, such as a trench, with a fluoropolymer layer, preventing lateral etching by radicals. During the etch step reactive radicals, assisted by incident ions, remove the polymer from the bottom of the feature, thus etching the underlying silicon.

Dimensions and aspect ratios, AR, of TSVs strongly depend on the applied integration approach, e.g. TSV first, TSV middle or TSV last, and range from 1 µm to 100 µm in diameter (AR 1:2 up to 1:20). The silicon sidewall profile is known to significantly affect the electrical performance of the final structure, because it is prone to adversely affect subsequent cleaning-, isolation- and metal-filling processes. Moreover, a scalloped shape impacts the maximum electrical field at this silicon tips when voltage is applied. According to simulations reported by C. Laviron et al., a change in the scallop size and geometrical appearance is able to increase the maximum electrical field by up to 78% when compared to a smooth sidewall. (see C. Laviron, B. Dunne, V. Lapras, P. Galbiati, D. Henry, F. Toia, S. Moreau, R. Anciant, C. Brunet-Manquat, N. Sillon, "Via First Approach Optimisation for Through Silicon Via Applications", Conference: Electronic Components and Technology Conference (ECTC), 2009). Therefore, a reduction of scallop size and limitation of sidewall defects creating sharp tips or needles help to increase the overall electrical performance of the TSV structure and its reliability against electrical breakdown.

FIG. 4 shows a schematic of defect formation on the silicon sidewall of a TSV structure during DRIE processing. In a publication by Jae Woong Choi et al. three different type of Si sidewall defects and mechanisms of its formation are described (see J. W. Choi, W. L. Loh, S. K. Praveen, R. Murphy, E. T. K. Swee, "A study of the mechanisms causing surface defects on sidewalls during Si etching for TSV (through Si via)", J. Micromech. Microeng. 23 (2013)). The drawings from (a) to (d) show the development of silicon sidewall etch defects, resulting from e.g. voids in the passivating polymer layer in the DRIE process sequence. These defects significantly increase the roughness of the TSV sidewall in the affected area. Although the passivation polymer will be deposited several times throughout the TSV formation, it is getting thinner in some areas and the deposition- and removal rate will get imbalanced. This often results in a very rough silicon sidewall with small silicon particles or pieces encapsulated in the isolation oxide layer. Imaging of x-sections suggests that the passivation polymer has been broken through and has been under-etched severely. In such a worst case scenario a silicon tip emerging from the sidewall is directly contacting the TSV metallization, which may cause an electrical short circuit. A less pronounced sidewall defect may have the form of a silicon needle, which is not completely protruding the isolation oxide. This defect isn't causing a time zero leakage fail of the TSV structure, because there may not be a direct contact between the TSV metal and bulk silicon. Nevertheless, silicon needles may lead to a local reduction of the isolation thickness thus potentially leading to a lowered breakdown voltage.

Increasing the isolation oxide thickness or utilization of different dielectric materials may serve as a counteraction to improve the leakage current, ILEAK, and breakdown voltage, BV, performance based on sidewall roughness. However, both approaches have some limitations: while the former is limited to a certain thickness as stress on the sidewall induced by the oxide has to be kept in a reasonable regime to avoid cracking, the latter requires an implementation of new equipment and/or new processes with new materials.

It is an objective to provide a method of producing a semiconductor body with a trench, a semiconductor body with at least one trench and a semiconductor device which are less prone to defect formation.

These objectives are achieved by the subject matter of the independent claims. Further developments and embodiments are described in dependent claims.

SUMMARY OF THE INVENTION

It is to be understood that any feature described in relation to any one embodiment may be used alone, or in combination with other features described herein, and may also be used in combination with one or more features of any other of the embodiments, or any combination of any other of the embodiments unless described as an alternative. Furthermore, equivalents and modifications not described below may also be employed without departing from the scope of the method of producing a semiconductor body, the semiconductor body and semiconductor device which are defined in the accompanying claims.

The following also relates to an improved concept in the field of interconnect technology, such as vertical electrical connections, via, including through-silicon via, TSV. For example, following the improved concept a semiconductor body can be manufactured with a trench. Among other steps this may be realized by an oxidation step prior to the actual chemical vapor deposition, CVD, based passivation layer or isolation oxide deposition step, for example.

The oxidation step may be based on an atmospheric pressure plasma oxidation using a gas mixture, e.g. containing Helium and Oxygen. The improved concept may involve a sequence of method steps including the additional oxidation step along the following lines. A sidewall defect (pocketing) may be created during a DRIE process. An isolation oxide is deposited on the sidewall by converting substrate material into its oxide. Thus, a thin $SiO_2$ layer is formed by oxidation of bulk Si, essentially converting Si to $SiO_2$, for example. A passivation layer, such as an additional isolation oxide, is deposited on the $SiO_2$ layer. The passivation layer or isolation oxide is etched to remove oxide from the trench to form a TSV bottom. A metallization such as Tungsten, W, can be deposited into the trench. Due to high oxide loss during isolation etch, distance between Si and W is reduced compared to a sidewall which has not been manufactured using the improved concept.

In at least one embodiment a method of producing a semiconductor body with a trench comprises the following steps. The semiconductor body comprises a substrate. First, the trench is etched into the substrate using an etching mask. An oxide layer is formed at least on a sidewall of the trench by means of oxidation of the substrate. A passivation layer is formed on the oxide layer and the bottom of the trench. The passivation layer is removed from the bottom of the trench. Finally, a metallization layer is deposited into the trench.

For example, etching the trench uses a deep etching process, such as Deep reactive-ion etching, DRIE, or Bosch process, or any other sequence for creating deep penetration, steep-sided holes or trenches into wafers or substrates. The remaining sequence of method steps discussed above may follow the etching in order to reduce the impact of defects which may have been created in the substrate during etching.

The oxide layer is formed by oxidation of the substrate. This oxidation can be considered a direct process which converts substrate material into its oxide, e.g. silicon, Si, into silicon dioxide, $SiO_2$. Only in the next step, i.e. forming the passivation layer an oxidized substrate may be deposited as a layer onto a surface of the semiconductor body, e.g. on the oxide layer and the bottom of the trench. This may be established by means of a CVD process. After removing the passivation layer at least from the bottom, the so prepared trench is deposited with a metallization layer which may be arranged as an electric interconnect, such as a TSV.

The oxidation step introducing the oxide layer may increase a distance between a defect (such as substrate tip or needle) and the metallization layer. Effectively, the oxide layer may increase an isolation layer thickness at the area of the sidewall defect by conversion of the substrate material into an oxide. With the adapted process sequence including the oxidation layer isolation deposition sequence an electrical interconnect structure, such as a TSV, can be manufactured with improved electrical performance and reduced susceptibility to said defects produced during deep etching, such as DRIE, for example. The proposed process sequence provides a method of producing a semiconductor body with a trench, e.g. for electrical interconnect structures such as TSVs, with reduced leakage current, increased process robustness and increased breakdown voltage. Besides yield improvement the method enables creation of 3D integrated, low leakage devices. TSVs can be manufactures with superior leakage current performance compared to common solutions.

In at least one embodiment the oxidation of the substrate involves a wet-chemical oxidation process. In addition, or alternatively, an oxidation is induced by an atmospheric plasma. Creating the oxidation layer, i.e. converting a layer of the semiconductor body into a layer of its oxide, can be realized in several ways. The wet-chemical oxidation process is a form of hydrothermal treatment which can be implemented with common chemical procedures. For example, in at least one embodiment the wet-chemical procedure involves an oxidizing agent which is applied into the trench via the etching mask.

The atmospheric plasma-based approach can be implemented under low pressure and low temperatures. For example, the processing plasma (also denoted cold plasma, non-thermal plasma, or non-equilibrium plasma) are typically operated at pressures of a few milli-torr to a few torr, the plasma can be ignited at atmospheric pressure as well. Temperatures may reach down to room temperature. This may reduce procedural efforts to create and maintain the plasma during the oxidation process. Furthermore, the semiconductor body and be manufactured at more convenient conditions including reduced stress and heat exposure. For example, in at least one embodiment the atmospheric plasma comprises an oxidizing species as a process gas. Examples of the process gas comprise ozone and/or oxygen.

In at least one embodiment the oxidation is performed at a temperature below the melting point of the substrate. In fact, it should be below the melting point of all materials involved (e.g. AlCu). Oxidation induced by means of the atmospheric plasma may have only little influence on the semiconductor body. Other known fabrication processes do not allow the application of thermal oxidation steps to reduce defect size, because of process temperatures above the melting point of the substrate, or any of the components of the semiconductor body, e.g. CMOS metal melting point (800 to 1200° C.). For example, in at least one embodiment the oxidation is performed at a temperature below 800° C. In addition, or alternatively, the oxidation is performed at a temperature ranging from 150° C. to 400° C. For example, oxidation of Silicon to $SiO_2$ up to thicknesses of some 60 nm can also be realized at relatively low temperatures ranging from 150° C. to 400° C. Temperatures may, however, reach down to room temperature. The plasma is created and applied under ambient pressure, or close to that pressure, for example.

In at least one embodiment the substrate comprises bulk silicon. Furthermore, the oxide layer comprises silicon dioxide $SiO_2$ which is formed by the oxidation of bulk silicon. Silicon is a prominent material for semiconductor production. Applying the proposed methodology thus allows for manufacture of a wide range of semiconductor bodies and devices. However, the method is not restricted to silicon. For example, in at least one embodiment the oxidation of bulk silicon is performed in an oxygen plasma such that a film of $SiO_2$ is grown on the sidewall at temperatures down to room temperature.

In at least one embodiment the oxygen plasma comprises a helium and oxygen mixture. By way of example, a concentration of oxygen equal to or smaller than 5%. The exact concentration of oxygen, however, may be subject to process considerations, i.e. concentration larger than 5% can be used as well.

In at least one embodiment the steps of etching the trench, forming the oxide layer, forming and removing the passivation layer are repeated until the trench has a desired depth and/or wherein further etching the trench into the substrate involves using the etching mask and the remaining passivation layer on the sidewall. For example, the steps can be repeated by running through a complete sequence. However, single steps, such as etching the trench, can be repeated a number of times until a next step in the sequence is entered.

For example, an unevenness in the trench, e.g. on the sidewall can be reduced by application of the passivation layer in a thermal oxidation process. This is because the thermal oxidation starts at every point of the surface.

During the oxidation, the oxygen may diffuse through the passivation layer. For example, the etching creates scallops in the sidewalls of the trench. Since the tips between the scallops are more exposed to oxygen, they are oxidized faster in comparison to another part of a scallop. The sidewall can be considered an interface between silicon and silicon dioxide, for example, and can be smoothed with increasing oxidation time or by repeating the formation of the passivation layer. The surface of the silicon dioxide is also smoothed during the oxidation process, for example.

In at least one embodiment the metallization is electrically connected to electrodes such that the trench is operable as a through-substrate via. The resulting TSV combines several advantages including reduced leakage current and increased breakdown voltage. 3D integrated and low leakage devices can be built.

In at least one embodiment a semiconductor body with at least one trench comprises a substrate. The trench comprises at least one sidewall and an oxide layer which is arranged at least on the sidewall of the trench. The oxide layer is formed from an oxidation of the substrate. A passivation layer is arranged on the oxide layer on the sidewall. Finally, a metallization layer is arranged in the trench.

The oxide layer may increase a distance between a defect (such as substrate tip or needle) and the metallization layer. Such defects may occur during manufacture of the semiconductor body, e.g. during deep etching of the trench. Effectively, the oxide layer may increase an isolation layer thickness at the area of a sidewall defect by conversion of the substrate material into an oxide. The so manufactured trench, including the oxidation layer isolation, can be used as a basis for an electrical interconnect structure, such as a TSV. The electrical interconnect features improved electrical performance and reduced susceptibility to said defects produced during deep etching, such as DRIE, for example. Further advantages include reduced leakage current and increased breakdown voltage. This enables creation of 3D integrated, low leakage devices. TSVs may have superior leakage current performance compared to common solutions.

In at least one embodiment the oxide layer comprises an oxide from the bulk substrate. The passivation layer comprises an oxide which has been applied onto the oxide layer so as to form an additional layer. In addition, or alternatively, the passivation layer comprises an oxide of the same substrate which has been applied onto the oxide layer so as to form the additional layer. Implementing the passivation layer as an additional oxide layer may further smoothen unevenness in the trench, e.g. the sidewalls.

In at least one embodiment a semiconductor device comprises at least one semiconductor body according to the concept discussed above. At least one electrical component and the at least one trench is operable as a through-substrate via and electrically connected to the at least one electrical component.

The at least one electrical component can be implemented in many different ways. In fact, the proposed semiconductor body and the method of producing a semiconductor body can be applied in many different areas, e.g. to create 3D packages and 3D integrated circuits. A 3D IC can be considered a MOS (metal-oxide semiconductor) integrated circuit (IC) manufactured by stacking wafers or dies and interconnecting them vertically using electrical interconnects, for instance, based on the proposed trench. Typically, the trench, or trenches, is implemented as a through-silicon via. The proposed semiconductor body and electrical interconnect allows for further miniaturizing semiconductor device and combine a plurality of functions and sensor capabilities into single devices and single packages.

In at least one embodiment the at least one electrical component comprises a photodiode structure, such as a pn-junction or pin-junction. The photodiode structure, or several of such structures, are typically used to create sensors of various types. These sensors include optical sensors, image sensors or hybrid sensors such as proximity, time-of-flight, gesture, and LIDAR sensors, the latter combining illumination and detection capabilities in a single device.

Further implementations of the semiconductor body and semiconductor device are readily derived from the various implementations and embodiments of the method of producing a semiconductor body discussed above, and vice versa.

BRIEF DESCRIPTION OF THE DRAWINGS

In the following, the concept presented above is described in further detail with respect to drawings, in which examples of embodiments are presented. In the embodiments and Figures presented hereinafter, similar or identical elements may each be provided with the same reference numerals. The elements illustrated in the drawings and their size relationships among one another, however, should not be regarded as true to scale, rather individual elements, such as layers, components, and regions, may be exaggerated to enable better illustration or a better understanding.

DETAILED DESCRIPTION

Figure 1:
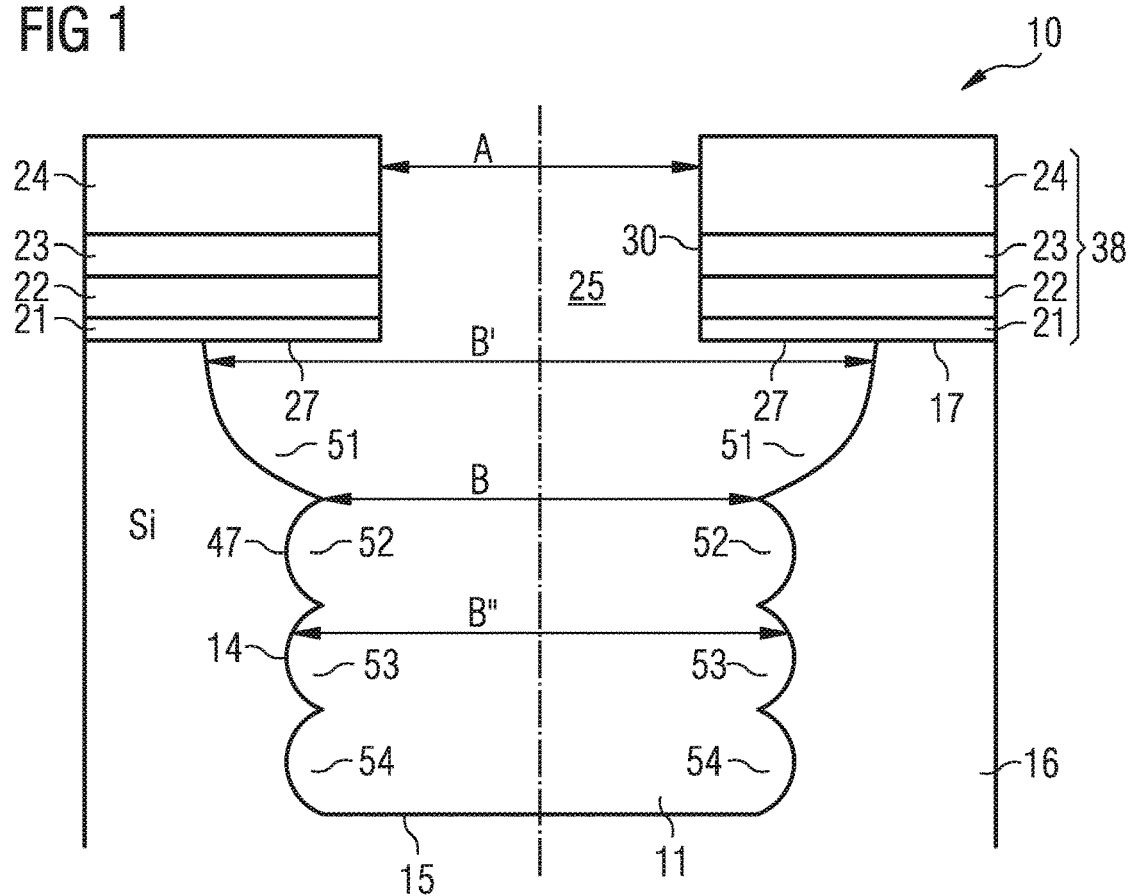
FIG. 1 shows cross section through an example embodiment of a semiconductor body.

FIG. 1 shows cross section through an example embodiment of a semiconductor body. The semiconductor body 10 comprises an etching mask 38 which features a recess 25. The etching mask 38 may have several layers such as a hard-mask oxide layer 21, a nitride layer 22, a polysilicon layer 23 and a photoresist 24, for example. A trench 11 in the semiconductor body 10 extends perpendicular to a first main surface 17 of the semiconductor body 10. The trench 11 comprises a sidewall 14 and a bottom 15. The trench 11 extends from the first main surface 17 to the bottom 15 and is aligned orthogonally to the first main surface 17. The trench 11 has a depth T and a width D. In this case, the depth T corresponds to the distance between the bottom 15 and the first main surface 17. The first main surface 17 represents one of the boundaries of the substrate material 16.

The trench 11 may be produced by means of a deep etching process, during which two different gas compositions alternately act upon the semiconductor body 10. The deep etching process can be based on a process flow based on deep reactive-ion etching, DRIE, which is a highly anisotropic etch process used to create deep penetration, steep-sided holes and trenches in wafers/substrates, and allows for high aspect ratios. The first gas composition produces a polymer on the surface of the substrate, i.e. on a side wall 14 and bottom 15 of the trench 11. The second gas composition serves for etching the substrate material 16. The two gases can be $C_4F_8$ as the first gas and $SF_6$ as the second gas, for example. The polymer on the bottom 15 is removed, e.g. by means of a sputtering process while the second gas composition is in the reactor chamber. Removal is affected by means of the physical stage of the deep etching process. The polymer on the side wall 14 is only slightly dissolved by the chemical stage of the process and therefore serves to protect the side wall 14 from being etched by the second gas composition.

The etching and deposition processes alternate cyclically. Since the first and second gas composition also act on the semiconductor body 10 alternately, scallops 51 to 54 are produced in the side wall 14 of the trench 11 as shown in FIG. 1. If the processing time for the first application of the second gas composition is chosen to be longer than the processing times for the other applications of the second gas composition in the subsequent cycles, it is possible to produce a first scallop 51, with dimensions parallel and perpendicular to the first main surface 17 that are greater than those of the other scallops 52 to 54. Consequently, an undercut 27 of the etching mask arrangement 38 is achieved by means of the first scallop 51. This means that the width B of the trench 11 can be increased relative to the width A of the recess 25 of the etching mask arrangement 38. A width B' in the region of the first scallop 51 is greater than a width B" in the region of the other scallops 52 to 54. The scallops 51 to 54 are generated because the gas composition and, thus, the effects of the different gas compositions on the semiconductor substrate change periodically.

An exemplary procedure could be summarized as follows:

Step 1: An etching gas composition is introduced into an etching reactor. The etching gas isotropically etches Silicon. The composition comprises $SF_6$. The gas etches silicon at regions of the semiconductor body which are not covered by an etch mask. Since the gas performs an isotropic etching effect, a first cavity is generated, wherein the etch mask is underetched. Thus, a first scallop is created.

Step 2: A deposition gas composition is introduced in the etching reactor which generates a polymer layer on top of the surface including the cavity. The composition comprises $C_4F_8$.

Step 3: The etching gas composition is introduced again. A gas of the etching gas composition performs an anisotropic etching. Thus, this gas removes the polymer at the bottom of the cavity. The sidewalls of the cavity are still covered by the polymer.

Steps 1 and 3 can be repeated as required and until the trench 11 has a desired depth T. The etching gas composition again etches silicon isotropically in regions where no etch mask such as the polymer layer exists. The silicon at the bottom of the cavity is removed, the polymer etch mask is underetched and, thus, a second cavity below the first cavity with a second scallop is generated.

Figure 2A:
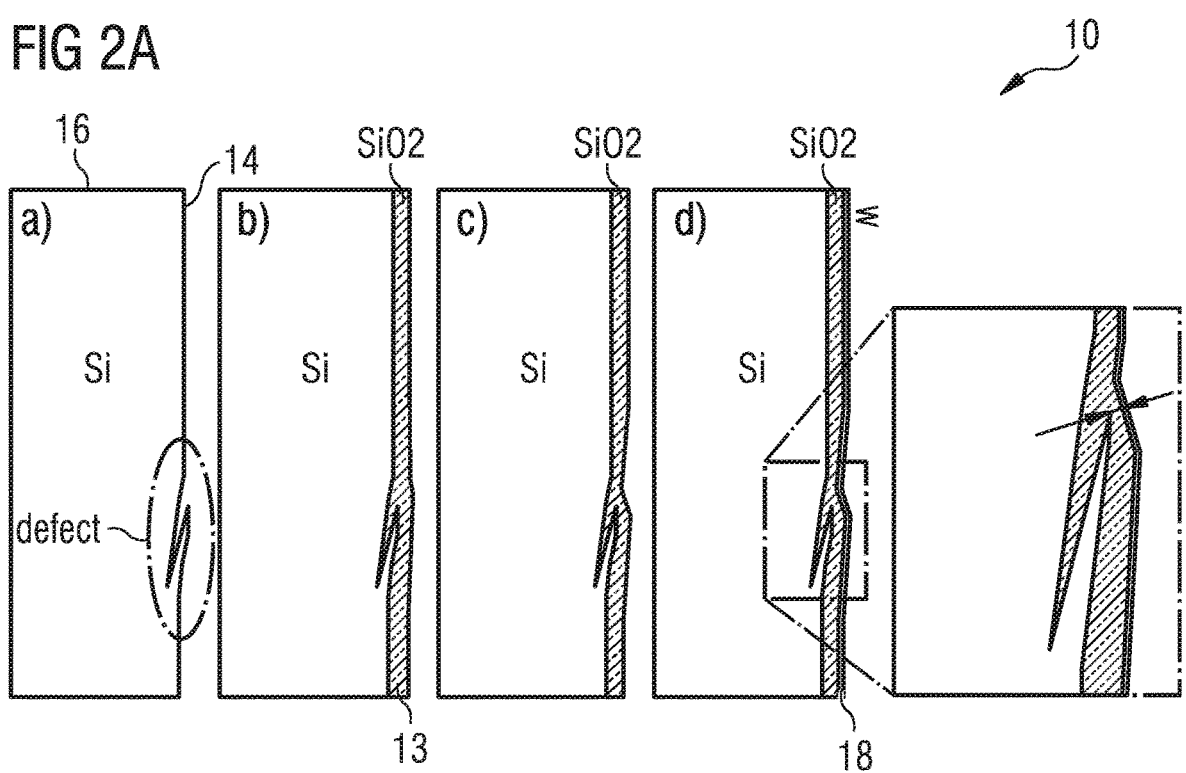
FIG. 2A shows an example process sequence of producing a semiconductor body with a trench.

FIG. 2A shows an example process sequence of producing a semiconductor body with a trench. During a deep etching process, such as the DRIE process discussed above, defects can develop in the semiconductor body. In the worst case sharp tips emerge and extend from the sidewall 14. Often such tips cannot be sufficiently covered in additional process steps, e.g. by means of dielectric material applied to the sidewalls.

An example process sequence is depicted in FIG. 2A for easy reference. The drawing shows part of a sidewall inside a trench 11. In step a) a sidewall defect (often denoted pocketing) is created during the DRIE process. Creation of a pocket results in a thin sharp tip (needle-like) protruding from the sidewall 14. In a next step b) a passivation layer, e.g. an isolation oxide layer, is deposited onto the sidewall 14. The defect is also covered with the oxide layer. As a consequence the oxide-step develops as defect as well. In step c) the isolation oxide layer is etched anisotropically so as to remove oxide from the bottom 15 of the trench (not shown). This also increases oxide loss at the oxide step at the defect site. In order to render the trench 11 operable as an electronic interconnect, such as a TSV, a metallization layer, e.g. tungsten W, is deposited onto the sidewall 14.

Due to the high oxide loss during isolation etch, however, a distance between the semiconductor body (Si) and the metallization layer (W) is reduced compared to a region without a defect (indicated with the red arrow in the outtake of step d)). As discussed above the defect may decrease electrical performance of the trench when used as electrical interconnect and may reduce reliability against electrical breakdown. Typically a defect site or needle leads to local reduction of isolation thickness and potentially leading to a lowered breakdown voltage.

Figure 2B:
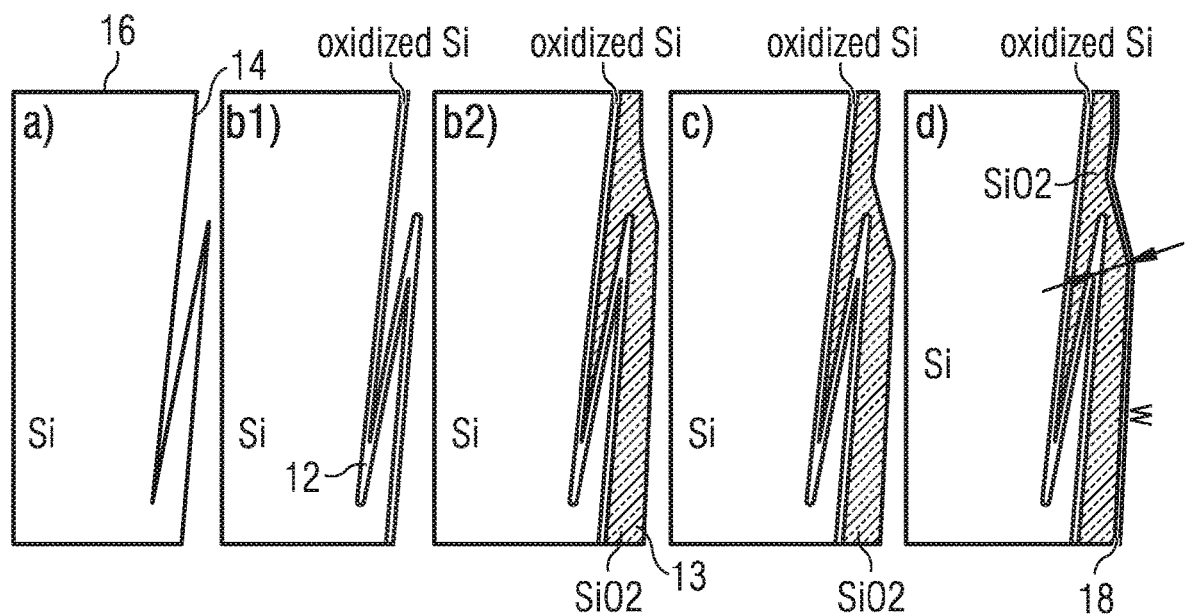
FIG. 2B shows an example process sequence of producing a semiconductor body with a trench.

FIG. 2B shows an example process sequence of producing a semiconductor body with a trench. The process sequence discussed in FIG. 2A can be complemented with forming an oxide layer at least on a sidewall of the trench 11 by oxidation of the substrate. This step is different from the applying the passivation layer, such as the isolation oxide layer, discussed in FIG. 2A. In fact, forming the oxide layer involves oxidation of the substrate directly, i.e. the bulk substrate is oxidized as opposed to depositing oxidized substrate onto the semiconductor body, e.g. in a CVD process. This way the oxide layer is formed by converting the material of the semiconductor body into an oxide of said material, e.g. silicon, Si, into silicon dioxide, $SiO_2$.

The process sequence in FIG. 2B comprises step a) wherein the deep etching or DRIE is executed. Eventually, a sidewall defect is created during the DRIE process. In step b1) the oxide layer is created by oxidation of the semiconductor material. This way Si is converted and a thin $SiO_2$ layer is formed by oxidation of the bulk Si (converting Si to $SiO_2$). The following step b2) corresponds to step b) in FIG. 2A. Thus, a passivation layer, e.g. an additional isolation oxide layer, is deposited onto the sidewall 14 covered with the oxide layer. The defect is also covered with two oxide layers. As a consequence the oxide-step develops a defect as well.

In step c) the isolation oxide layer is etched so as to remove oxide from the bottom 15 of the trench (not shown). This also increases oxide loss at the oxide step at the defect site. In order to render the trench 11 operable as an electronic interconnect, such as a TSV, a metallization layer, e.g.

tungsten W, is deposited onto the sidewall 14. Due to the high oxide loss during isolation etch, however, a distance between the semiconductor body (Si) and the metallization layer (W) is reduced compared to a region without a defect (indicated with the red arrow in the outtake of step d)).

Creating the oxidation layer, i.e. converting a layer of the semiconductor body into a layer of its oxide, can be realized in several ways. One possibility involves a wet-chemical oxidation process. This procedure involves an oxidizing agent which is applied into the trench via the etching mask. Another possibility involves an oxidation induced by an atmospheric plasma.

The atmospheric plasma, also denoted cold plasma, non-thermal plasma, or non-equilibrium plasma, comprises an oxidizing species as process gas, such as ozone and/or oxygen. This type of oxidation is performed at a temperature below the melting point of the substrate. For example, the oxidation is performed at a temperature below 800° C., or, typically, at a temperature from a range of 150° C. to 400° C. Temperatures may, however, reach down to room temperature. The plasma is created and applied under ambient pressure, or close to that pressure.

The oxidation of bulk silicon is performed in an Oxygen plasma such that a film $SiO_2$ is grown on the sidewall, for example. For example, an Oxygen plasma is used and comprises a Helium and Oxygen mixture, e.g. with a concentration of Oxygen equal or smaller than 5%.

Plasma-enhanced chemical vapor deposition, PECVD, can be used to apply the plasma and initiate oxidization. PECVD is a chemical vapor deposition process used to deposit thin films from a plasma to a solid state on a substrate. In general, there are known ways to create the oxide layer using PECVD. For example, Silicon dioxide can be deposited using a combination of silicon precursor gasses like dichlorosilane or silane and oxygen precursors, such as oxygen and nitrous oxide, typically at pressures from a few millitorr to a few torr. Plasma-deposited silicon nitride, formed from silane and ammonia or nitrogen, can also be used. Plasma nitrides always contain a large amount of hydrogen, which can be bonded to silicon (Si—H) or nitrogen (Si—NH). This hydrogen has an important influence on IR and UV absorption, stability, mechanical stress, and electrical conductivity. This can be used as a surface and bulk passivating layer. Silicon oxide can also be deposited from a tetraethoxysilane (TEOS) silicon precursor in an oxygen or oxygen-argon plasma. These films can be contaminated with significant carbon and hydrogen as silanol, and can be unstable in air. Pressures of a few torr and small electrode spacing, and/or dual frequency deposition, are helpful to achieve high deposition rates with good film stability. High-density plasma deposition of silicon dioxide from silane and oxygen/argon can be used to create a nearly hydrogen-free film with good conformity over complex surfaces, the latter resulting from intense ion bombardment and consequent sputtering of the deposited molecules from vertical onto horizontal surfaces.

Figure 2C:
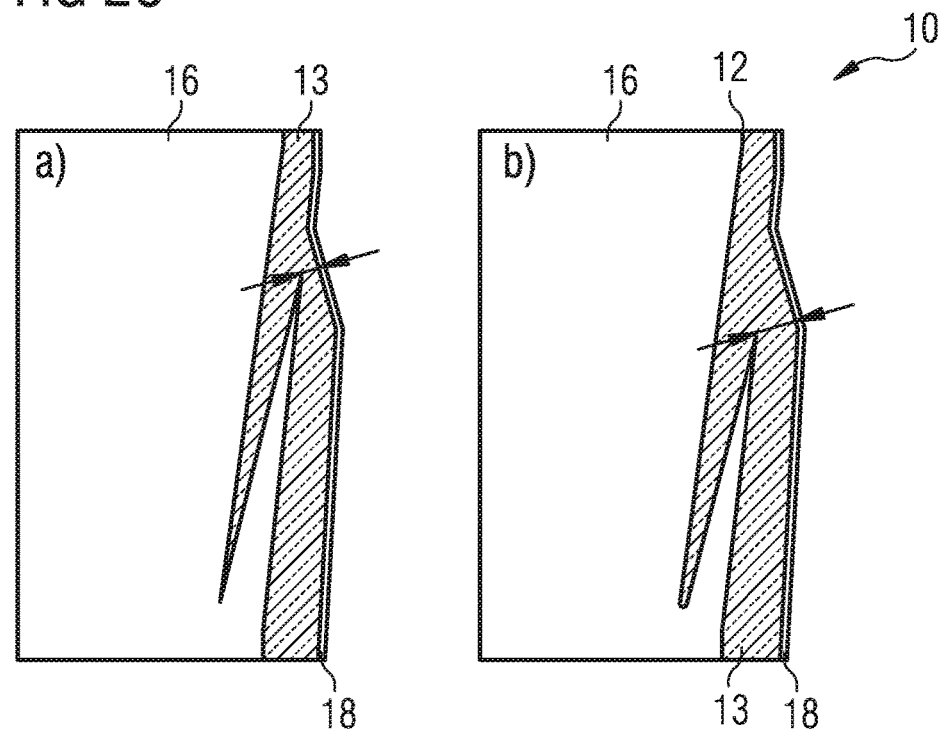
FIG. 2C shows a comparison of sidewall defects.
Figure 3:
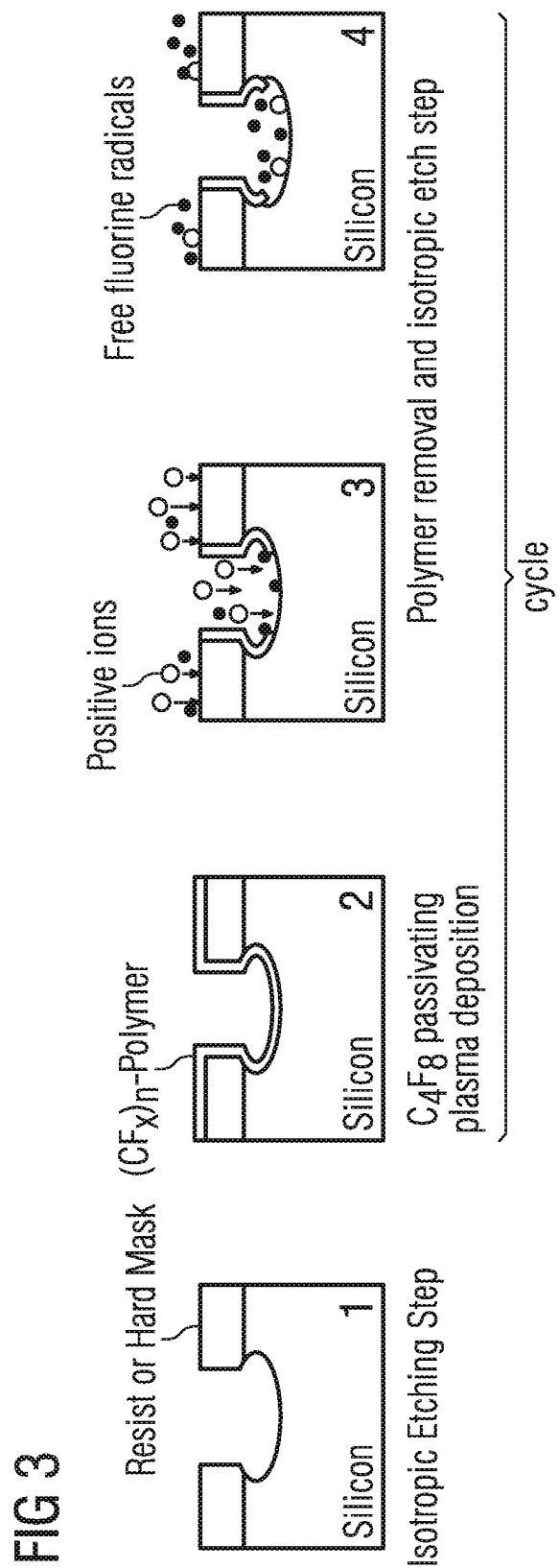
FIG. 3 shows a flowchart of an example Bosch process.
Figure 4:
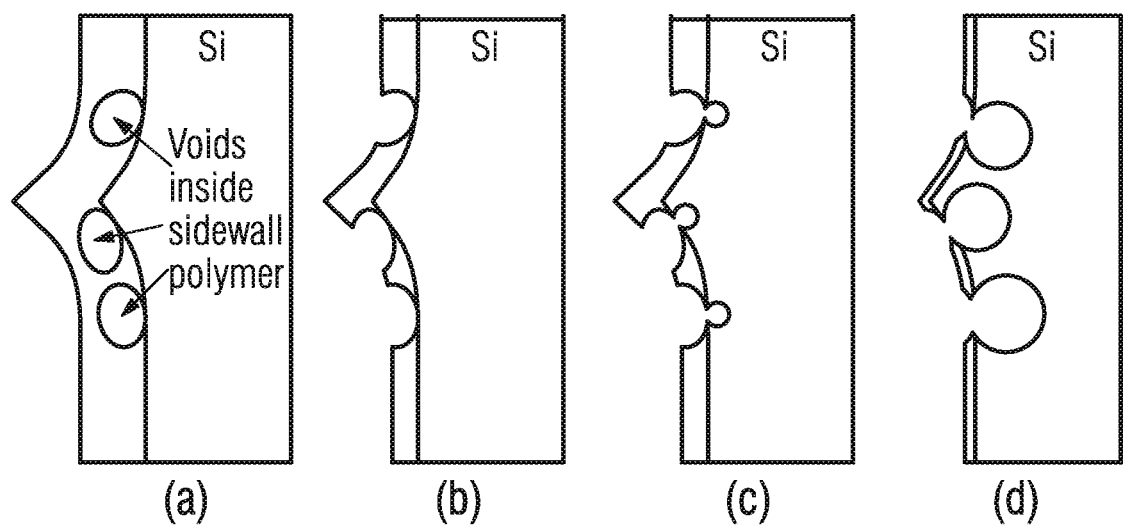
FIG. 4 shows a schematic of defect formation on the silicon sidewall of a TSV structure during DRIE processing.

FIG. 2C shows a comparison of sidewall defects. The left side of the drawing shows a sidewall defect treated without the additional oxidation layer, the right side of the drawing shows a sidewall defect treated with the additional oxidation layer. As indicated by the arrows with additional oxidation step a distance between the defect (such as Si tip/needle) and metallization layer such as tungsten, W) can be significantly increased. The oxide layer introduced by the oxidation step helps to increase the isolation layer thickness at the area of the sidewall defect by conversion of bulk Si into $SiO_2$. With the adapted process sequence including the oxidation layer isolation deposition sequence an electrical interconnect structure, such as a TSV, can be manufactured with improved electrical performance and reduced susceptibility to sidewall defects produced during deep etching such as DRIE. The proposed process sequence provides a method of producing a semiconductor body with a trench, e.g. for electrical interconnect structures such as TSVs, with reduced leakage current, increased process robustness and increased breakdown voltage. Besides yield improvement the method enables creation of 3D integrated, low leakage devices. TSVs can be manufactures with superior leakage current performance compared to common solutions. SEM x-section of the semiconductor body have been found that the different oxide layer (Si-Oxide layers) can be distinguished.

The invention claimed is:

1. A method of producing a semiconductor body with a trench, wherein the semiconductor body comprises a substrate, the method comprising:
   etching the trench into the substrate using an etching mask,
   forming an oxide layer at least on a sidewall of the trench by oxidation of the substrate,
   forming a passivation layer on the oxide layer and a bottom of the trench,
   removing the passivation layer from the bottom of the trench, and
   depositing a metallization layer into the trench;
   wherein the steps of etching the trench, forming the oxide layer, and forming and removing the passivation layer are repeated until the trench has a desired depth.

2. The method according to claim 1, wherein the oxidation of the substrate involves:
   a wet-chemical oxidation process, and/or
   an oxidation induced by an atmospheric plasma.

3. The method according to claim 2, wherein the wet-chemical procedure involves an oxidizing agent which is applied into the trench via the etching mask.

4. The method according to claim 2, wherein the atmospheric plasma comprises an oxidizing species as process gas.

5. The method according to claim 2, wherein the atmospheric plasma comprises ozone and/or oxygen.

6. The method according to claim 1, wherein the oxidation is performed at a temperature below the melting point of the substrate and/or other materials used for the semiconductor.

7. The method according to claim 1, wherein
   the oxidation is performed at a temperature below 800° C., and/or
   the oxidation is performed at a temperature from a range of 150° C. to 400° C.

8. The method according to claim 1, wherein
   the substrate comprises bulk silicon, and
   the oxide layer comprises $SiO_2$, which is formed by the oxidation of bulk silicon.

9. The method according to claim 8, wherein the oxidation of bulk silicon is performed in an oxygen plasma such that a film $SiO_2$ is grown on the sidewall at temperatures down to room temperature.

10. The method according to claim 9, wherein the oxygen plasma comprises a Helium and Oxygen mixture.

11. The method according to claim 1, wherein
    further etching the trench into the substrate involves using the etching mask and the remaining passivation layer on the sidewall.

12. The method according to claim 1, wherein the metallization is electrically connected to electrodes such that the trench is operable as a through-substrate via.

13. The method according to claim 1, wherein the steps of etching the trench, forming the oxide layer, and forming and removing the passivation layer are performed in sequence.

* * * * *